US012610714B2

(12) United States Patent
Cao et al.

(10) Patent No.: US 12,610,714 B2
(45) Date of Patent: Apr. 21, 2026

(54) DISPLAY PANEL, DISPLAY DEVICE AND METHOD FOR MANUFACTURING DISPLAY PANEL

(71) Applicants: CHANGSHA HKC OPTOELECTRONICS CO., LTD., Changsha (CN); HKC CORPORATION LIMITED, Shenzhen (CN)

(72) Inventors: Shangcao Cao, Shenzhen (CN); Kerong Wu, Shenzhen (CN); Rongrong Li, Shenzhen (CN)

(73) Assignees: CHANGSHA HKC OPTOELECTRONICS CO., LTD., Changsha (CN); HKC CORPORATION LIMITED, Shenzhen (CN)

( * ) Notice: Subject to any disclaimer, the term of this patent is extended or adjusted under 35 U.S.C. 154(b) by 403 days.

(21) Appl. No.: 18/275,014

(22) PCT Filed: Dec. 28, 2022

(86) PCT No.: PCT/CN2022/142678
§ 371 (c)(1),
(2) Date: Jul. 30, 2023

(87) PCT Pub. No.: WO2024/016600
PCT Pub. Date: Jan. 25, 2024

(65) Prior Publication Data
US 2025/0056997 A1 Feb. 13, 2025

(30) Foreign Application Priority Data
Jul. 22, 2022 (CN) .......................... 202210865861.0

(51) Int. Cl.
*H10K 59/38* (2023.01)
*H10K 50/13* (2023.01)
(Continued)

(52) U.S. Cl.
CPC ......... *H10K 59/38* (2023.02); *H10K 59/1201* (2023.02); *H10K 59/122* (2023.02)

(58) Field of Classification Search
CPC ........ H10K 59/38; H10K 59/35; H10K 50/13; H01L 27/322; H01L 51/504
See application file for complete search history.

(56) References Cited

U.S. PATENT DOCUMENTS

| | | | | |
|---|---|---|---|---|
| 10,672,838 B2 * | 6/2020 | Nishikiori | .............. | H10K 71/40 |
| 12,232,399 B2 * | 2/2025 | Xu | ..................... | H10K 59/1201 |

(Continued)

FOREIGN PATENT DOCUMENTS

| | | |
|---|---|---|
| CN | 104112761 A | 10/2014 |
| CN | 105027313 A | 11/2015 |

(Continued)

OTHER PUBLICATIONS

Shen, Dongyun, the ISA written comments. Mar. 2023, CN.
Shen, Dongyun, the International Search Report, Mar. 2023, CN.
Korea Patent Office Examination Report for 10-2023-7032671.

*Primary Examiner* — Joseph L Williams

(57) ABSTRACT

This application discloses a display panel, a display device, and a method for manufacturing the display panel. A substrate, an anode, a pixel defining layer, a light-emitting layer, and a cathode are arranged in sequence. The cathode covers the light-emitting layer and the pixel defining layer. The filter layer is disposed on a side of the cathode facing away from the substrate. The second light-emitting region corre- (Continued)

sponds to the blue color filter. The second light-emitting region includes a blue light-emitting layer made of a blue light emitting material.

19 Claims, 6 Drawing Sheets

(51) Int. Cl.
*H10K 59/12* (2023.01)
*H10K 59/122* (2023.01)
*H10K 59/35* (2023.01)

(56) References Cited

U.S. PATENT DOCUMENTS

| | | |
|---|---|---|
| 2006/0238118 A1 | 10/2006 | Spindler |
| 2014/0183471 A1 | 7/2014 | Heo |

FOREIGN PATENT DOCUMENTS

| | | | |
|---|---|---|---|
| CN | 106098954 A | 11/2016 |
| CN | 109036130 A | 12/2018 |
| CN | 109616581 A | 4/2019 |
| CN | 11430567 A | 7/2020 |
| CN | 116274796 A | 11/2022 |
| JP | 2008539554 A | 11/2008 |
| KR | 20140085951 A | 7/2014 |
| KR | 20190038320 A | 4/2019 |

* cited by examiner 511  512  511  513  522  521

510  520

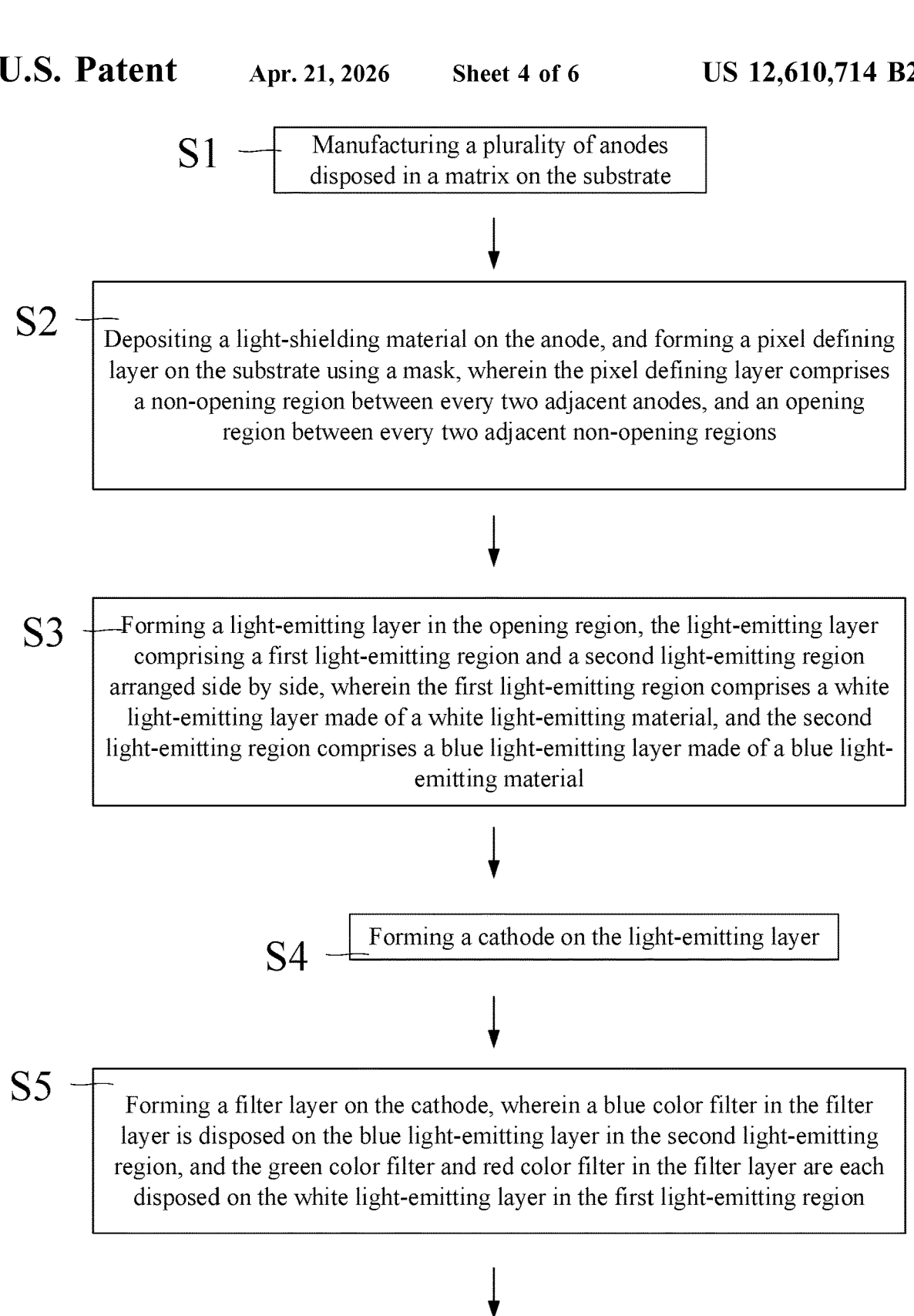

S1 — Manufacturing a plurality of anodes disposed in a matrix on the substrate

S2 — Depositing a light-shielding material on the anode, and forming a pixel defining layer on the substrate using a mask, wherein the pixel defining layer comprises a non-opening region between every two adjacent anodes, and an opening region between every two adjacent non-opening regions S3 — Forming a light-emitting layer in the opening region, the light-emitting layer comprising a first light-emitting region and a second light-emitting region arranged side by side, wherein the first light-emitting region comprises a white light-emitting layer made of a white light-emitting material, and the second light-emitting region comprises a blue light-emitting layer made of a blue light-emitting material S4 — Forming a cathode on the light-emitting layer S5 — Forming a filter layer on the cathode, wherein a blue color filter in the filter layer is disposed on the blue light-emitting layer in the second light-emitting region, and the green color filter and red color filter in the filter layer are each disposed on the white light-emitting layer in the first light-emitting region S6 — Forming a packaging layer on the filter layer to obtain the display panel

FIG. 7

DISPLAY PANEL, DISPLAY DEVICE AND METHOD FOR MANUFACTURING DISPLAY PANEL

CROSS-REFERENCE TO RELATED APPLICATIONS

This application is a United States national stage application of co-pending International Patent Application Number PCT/CN2022/142678, filed Dec. 28, 2022, which claims the priority and benefit of Chinese patent application number 202210865861.0, entitled "Display Panel, Display Device and Method for Manufacturing Display Panel" and filed Jul. 22, 2022 with China National Intellectual Property Administration, the entire contents of which are incorporated herein by reference.

TECHNICAL FIELD

This application relates to the field of display technology, and more particularly relates to a display panel, a display device, and a method of manufacturing a display panel.

BACKGROUND

The description provided in this section is intended for the mere purpose of providing background information related to the present application but doesn't necessarily constitute prior art.

OLED (Organic Light Emitting Display, or organic electroluminescence display) is considered to be the next generation mainstream flat panel display technology by virtue of its excellent characteristics of self-illumination, no need for backlight, high contrast, thin thickness, wide viewing angle, fast response speed, being applicable to flexible panels, wide operating temperature range, simple structure and manufacturing process, etc., and so it is currently one of the most concerned technologies among flat-panel display technologies.

Among the full-color methods for the OLED display panel, the filter method needs to use a white organic light-emitting diode as a backlight, and add filters to display red, green, and blue light. However, due to the severe attenuation of the brightness of the blue pixels, the light-emitting efficiency and lifespan of the display device are both reduced, resulting in the problem of insufficient product performance.

SUMMARY

In view of the above, it is one purpose of this application to provide a display panel, a display device and a method of manufacturing a display panel, so as to alleviate the attenuation of the brightness of blue pixels, increase the light-emitting efficiency of the display device and prolong the life of the OLED display panel.

The present application discloses a display panel, which includes: a substrate; an anode arranged in a matrix on the substrate; a pixel defining layer arranged on the substrate, including an opening region and a non-opening region disposed between two adjacent anodes; a light-emitting layer, arranged in the opening region; a cathode, covering the light-emitting layer and the pixel defining layer; and a filter layer, disposed on the side of the cathode away from the substrate. The light-emitting layer includes a first light-emitting region and a second light-emitting region. The first light-emitting region corresponds to each of the red color filter and green color filter in the filter layer. The second light-emitting region corresponds to the blue color filter in the filter layer. The second light-emitting region includes a blue light-emitting layer made of a blue light emitting material.

The application further discloses a display device. The display device includes a circuit board and a display panel, where the circuit board is electrically connected to the display panel. The display panel includes: a substrate; an anode arranged in a matrix on the substrate; a pixel defining layer arranged on the substrate, including an opening region and a non-opening region disposed between two adjacent anodes; a light-emitting layer, arranged in the opening region; a cathode, covering the light-emitting layer and the pixel defining layer; and a filter layer, disposed on the side of the cathode away from the substrate. The light-emitting layer includes a first light-emitting region and a second light-emitting region. The first light-emitting region corresponds to each of the red color filter and green color filter in the filter layer. The second light-emitting region corresponds to the blue color filter in the filter layer. The second light-emitting region includes a blue light-emitting layer made of a blue light emitting material.

The present application further discloses a method for manufacturing a display panel, which is used to manufacture the above-mentioned display panel, comprising the steps of: manufacturing a plurality of anodes arranged in a matrix on the substrate; depositing a light-shielding material on the anode, and forming a pixel defining layer disposed on the substrate through a mask, where the pixel defining layer between two adjacent anodes is a non-opening region, and an opening region is formed between two adjacent non-opening regions of the pixel defining layer; forming a light-emitting layer in the opening region that is composed of a first light-emitting region and a second light-emitting region arranged side by side, where the first light-emitting region includes a white light-emitting layer made of a white light-emitting material, and the second light-emitting region includes a blue light-emitting layer, where the blue light-emitting layer is made of a blue light-emitting material; forming a cathode on the light-emitting layer; forming a filter layer on the cathode, so that the blue color filter in the filter layer is disposed on the blue light-emitting layer in the second light-emitting region, and the green color filter and red color filter in the filter layer are each disposed on the white light-emitting layer in the first light-emitting region.

Compared with the scheme where the light-emitting layers corresponding to the three color filters of red, green and blue all adopt the white light-emitting layer, in this application, the second light-emitting region corresponding to the blue color filter is made of a blue light-emitting material, while the first light-emitting region corresponding to each of the red color filter and the green color filter is made of a white light-emitting material. Thus, in the operating state of the display panel, the light emitted by the second light-emitting region corresponding to the blue color filter is blue light, which can alleviate the problem of attenuation of the blue brightness of the display panel, thereby increasing the light-emitting efficiency of the display device and prolonging the service life of the display panel.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

FIG. 7 discloses a flow chart of a first method of manufacturing a display panel according to the present application.

DETAILED DESCRIPTION OF EMBODIMENTS

Figures 1, 2:
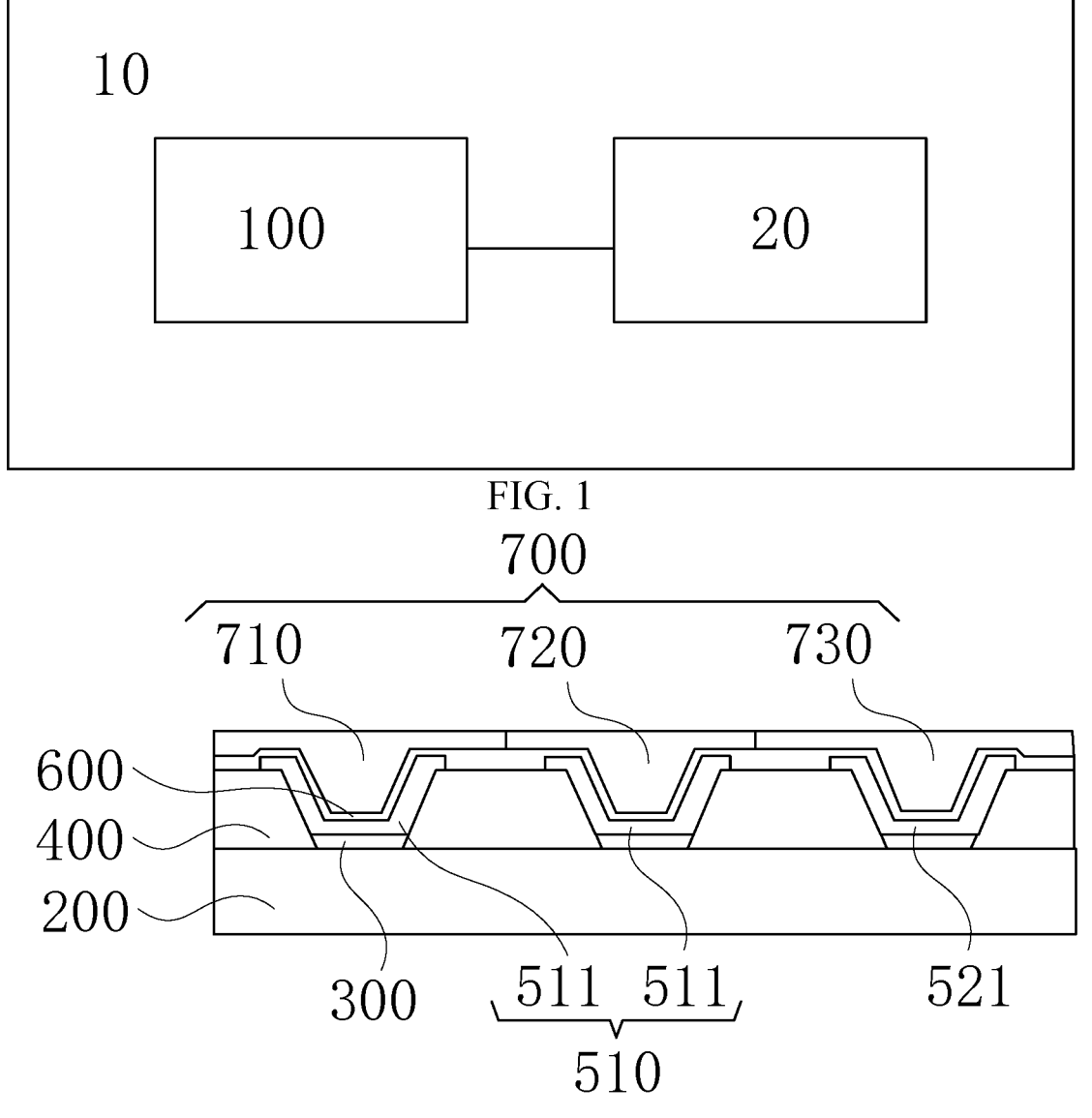
FIG. 1 is a schematic diagram of a display device according to the present application.
FIG. 2 discloses a schematic diagram of a display panel according to a first embodiment of the present application.

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple", "a plurality of", or the like mean two or more. Term "comprising", "including", and any variants thereof mean non-exclusive inclusion, so that one or more other features, integers, steps, operations, units, components, and/or combinations thereof may be present or added.

In addition, terms "center", "transverse", "up", "down", "left", "right", "vertical", "horizontal", "top", "bottom", "inside", "outside", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure.

Furthermore, as used herein, terms "installed on", "mounted on", "connected to", "coupled to", "connected with", and "coupled with" should be understood in a broad sense unless otherwise specified and defined. For example, they may indicate a fixed connection, a detachable connection, or an integral connection. They may denote a mechanical connection, or an electrical connection. They may denote a direct connection, a connection through an intermediate, or an internal connection between two elements. For those of ordinary skill in the art, the specific meanings of the above terms as used in the present application can be understood depending on specific contexts.

Hereinafter this application will be described in further detail with reference to the accompanying drawings and some optional embodiments.

FIG. 1 is a schematic diagram of a display device disclosed in the present application. As shown in FIG. 1, the present application discloses a display device 10. The display device 10 includes a circuit board 20 and a display panel 100. The circuit board 20 is electrically connected to the display panel 100, maybe through a flexible circuit board 20.

The present application further discloses a display panel, which can be used in the above display device. For the display panel, the application provides the following designs.

FIG. 2 discloses a schematic diagram of a display panel according to a first embodiment of the present application. As shown in FIG. 2, a display panel 100 is disclosed. The display panel 100 is an OLED display panel 100. The display panel 100 includes a substrate 200, an anode 300, a pixel defining layer 400, a light-emitting layer 500, a cathode 600, a filter layer 700, and a packaging layer 800.

The anodes 300 are arranged in a matrix on the substrate 200. The pixel defining layer 400 is disposed on the substrate 200, including an opening region and a non-opening region. The area between two adjacent anodes 300 is a non-opening region, and the pixel defining layer 400 forms an opening region adjacent to two non-opening regions. The light-emitting layer 500 is disposed in the opening region. The cathode 600 covers the light-emitting layer 500 and the pixel defining layer 400. The filter layer 700 is disposed on the side of the cathode 600 facing away from the substrate 200. The packaging layer 800 covers the filter layer 700.

The filter layer 700 includes three color filters of red, green and blue (referred to as RGB). Of course, yellow and white color filters may also be included. The color filters of different colors are separated by the pixel defining layer 400, where the colors are not limited here, and a filter layer 700 including three color filters of red, green and blue as is raised here an example.

The light-emitting layer 500 includes a first light-emitting region 510 and a second light-emitting region 520. The first light-emitting region 510 corresponds to the red color filter 710 and the green color filter 720 in the filter layer 700. The first light-emitting region 510 includes a white light-emitting layer 511 made of a white light emitting material. The light emitted by the white light-emitting material is white light, and the white light-emitting layer 511 is disposed corresponding to each of the red color filter 710 and the green color filter 720. The second light-emitting region 520 corresponds to the blue color filter 730 in the filter layer 700, and the second light-emitting region 520 includes a blue light-emitting layer 521. The blue light-emitting layer 521 is made of a blue light-emitting material, and the light emitted by the blue light-emitting material is blue light.

Compared with the scheme where the light-emitting layers 500 corresponding to the three color filters of red, green and blue all adopt the white light-emitting layer 511, in this application, the second light-emitting region 520 corresponding to the blue color filter 730 is made of a blue light-emitting material, while the first light-emitting region 510 corresponding to each of the red color filter 710 and the green color filter 720 is made of a white light-emitting material. Thus, in the operating state of the display panel 100, the light emitted by the second light-emitting region 520 corresponding to the blue color filter 730 is blue light, which can alleviate the problem of attenuation of the blue brightness of the display panel 100, thereby increasing the light-emitting efficiency of the display device and prolonging the service life of the display panel 100.

Furthermore, in the industry, the brightness of the blue pixel of the display panel 100 may be increased by increasing the voltage between the cathode 600 and the anode 300 corresponding to the blue color filter 730, but this will make the circuit of the display panel 100 more complicated and increase the burden on the driver chip. It is also possible to reduce the aperture ratio of the red color filter 710 and the green color filter 720, which is equivalent to increasing the aperture ratio of the blue color filter 730 in reverse, thereby alleviating the problem of attenuation of the blue brightness of the display panel 100. However, this will reduce the overall brightness of the display panel 100, which is not conducive to the display of the display panel 100.

In contrast, the present application alleviates the problem of attenuation of the blue brightness of the display panel 100 without changing the driving circuit and reducing the overall brightness of the display panel 100, thereby increasing the light-emitting efficiency of the display device and prolonging the life of the display panel 100.

The improvements of the present application have been explained in detail below by enumerating several embodiments, specifically as follows.

Embodiment 1

As shown in FIG. 2, the light-emitting layer 500 includes a first light-emitting region 510 and a second light-emitting region 520. The first light-emitting region 510 corresponds to each of the red color filter 710 and the green color filter 720 in the filter layer 700. The first light-emitting region 510 is a white light-emitting layer 511 made of a white light-emitting material, and the white light-emitting layer 511 is disposed corresponding to each of the red color filter 710 and the green color filter 720. The second light-emitting region 520 corresponds to the blue color filter 730 in the filter layer 700, and the second light-emitting region 520 is a blue light-emitting layer 521, where the blue light-emitting layer 521 is made of a blue light emitting material.

That is, the first light-emitting region 510 corresponding to the red color filter 710 and the green color filter 720 only emits white light, and the second light-emitting layer 500 region corresponding to the blue color filter 730 only emits blue light. Although the brightnesses of the first light-emitting region 510 and the second light-emitting region 520 are the same, since the second light-emitting region 520 only emits blue light, the blue brightness of the display panel 100 can be increased, thereby alleviating the problem of attenuation of the blue brightness of the display panel 100.

Further, the thickness of the blue color filter 730 in the filter layer 700 can also be reduced. That is, the thicknesses of the color filters of other colors such as the thickness of the green color filter 720 and the thickness of the red color filter 710 can be both greater than the thickness of the blue color filter 730. In this way, the transmittance of the blue light-emitting layer 521 can be further improved, and the blue brightness in the display panel 100 can be improved. Even the blue color filter 730 may not be needed, so that the problem of low blue brightness in the display panel 100 can be greatly alleviated.

Embodiment 2

Figures 3, 4, 5:
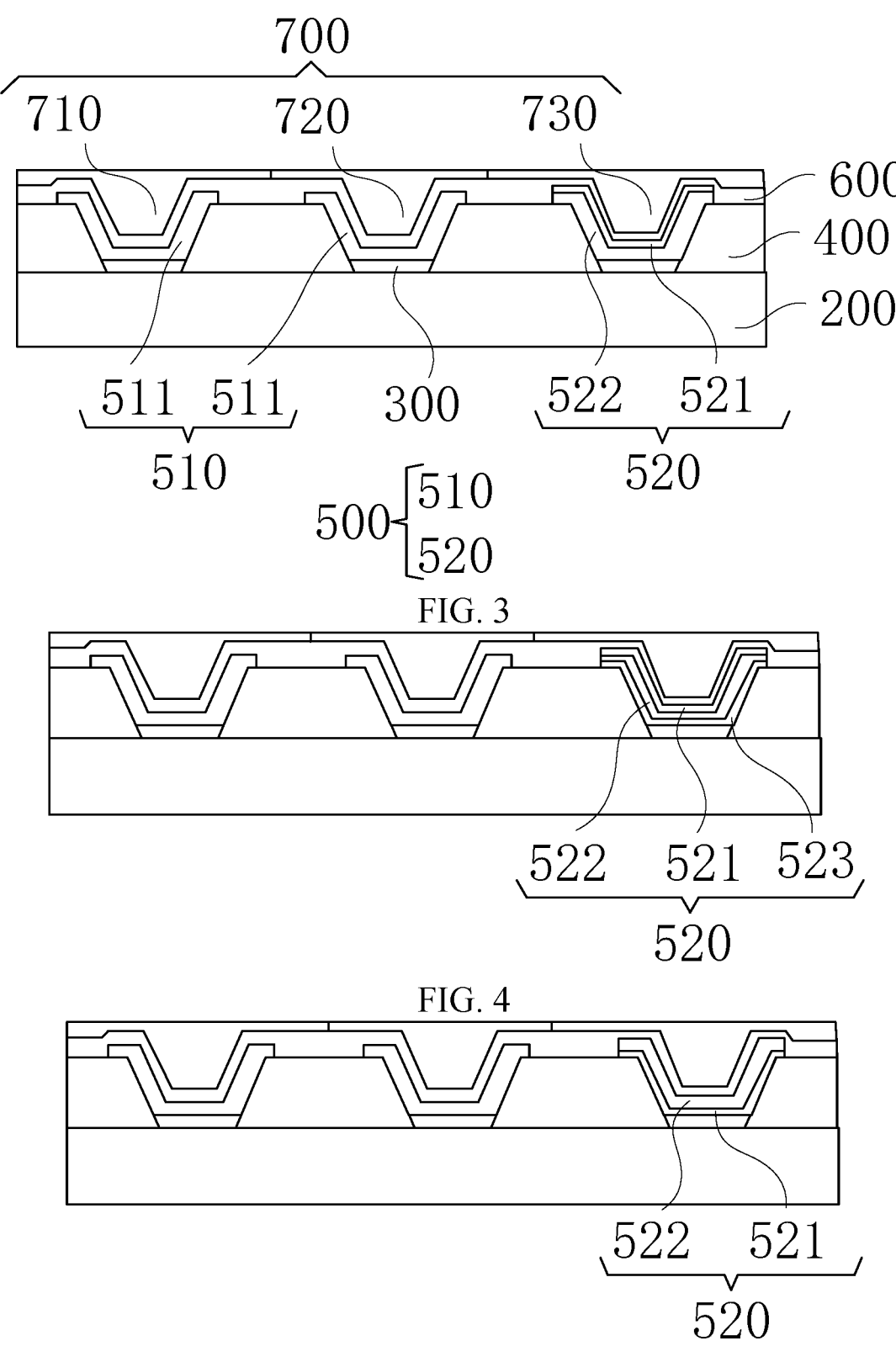
FIG. 3 discloses a schematic diagram of a display panel according to a second embodiment of the present application.
FIG. 4 discloses a schematic diagram of a display panel according to a third embodiment of the present application.
FIG. 5 discloses a schematic diagram of a display panel according to a fourth embodiment of the present application.

FIG. 3 discloses a schematic diagram of a display panel according to a second embodiment of the present application. As shown in FIG. 3, different from the first embodiment, the second light-emitting region 520 further includes a main light-emitting layer 522. The main light-emitting layer 522 is made of a white light emitting material, and the main light-emitting layer 522 is disposed between the anode 300 and the blue light-emitting layer 521.

That is, the blue light-emitting layer 521 is stacked on the main light-emitting layer 522 to further increase the brightness of the second light-emitting region 520, and the corresponding blue brightness in the display panel 100 is also increased accordingly.

When manufacturing the display panel 100, the main light-emitting layer 522 and the white light-emitting layer 511 of the first light-emitting region 510 in this embodiment are located in the same layer, which is equivalent to adding a blue light-emitting layer 521 between the main light-emitting layer 522 and the cathode 600 corresponding to the blue color filter 730, which can reduce the manufacturing process and improve the production efficiency.

Since the blue pixel is equivalent to be added with a layer of blue light-emitting layer 521, where the thickness of blue light-emitting layer 521 is 5-15 nm, this embodiment makes the color filters of other colors thicker, such as making the thickness of red color filter 710 and the thickness of the green color filter 720 each be greater than or equal to the sum of the thickness of the blue light-emitting layer 521 plus the thickness of the blue color filter 730. When the thickness of the red color filter 710 and the thickness of the green color filter 720 are each greater than the sum of the thickness of the blue light-emitting layer 521 plus the thickness of the blue color filter 730, the blue brightness in the display panel 100 is further improved. When the thickness of the red color filter 710 and the thickness of the green color filter 720 are each equal to the sum of the thickness of the blue light-emitting layer 521 and the thickness of the blue color filter 730, the film layers of the display panel 100 are smoother and flatter.

Furthermore, since this embodiment has a separate filter, when the blue light-emitting layer 521 is manufactured between the main light-emitting layer 522 and the cathode 600, even if the blue light-emitting layer 521 is printed between the white light-emitting layer 511 and the cathode 600 in the adjacent first light-emitting region 510, it will not cause blue light to appear in regions corresponding to color filters of other colors so as to result in color mixing.

Embodiment 3

FIG. 4 discloses a schematic diagram of a display panel according to a third embodiment of the present application. As shown in FIG. 4, different from the first embodiment, the second light-emitting region 520 further includes an auxiliary light-emitting layer 523. The auxiliary light-emitting layer 523 is disposed between the anode 300 and the main light-emitting layer 522. The auxiliary light-emitting layer 523 is made of a blue light emitting material. That is, it can be understood as that the blue light-emitting layer 521 is disposed between the cathode 600 and the main light-emitting layer 522, and the auxiliary light-emitting layer 523 is disposed between the anode 300 and the main light-emitting layer 522. The auxiliary light-emitting layer 523 is also equivalent to the blue light-emitting layer 521, which further improves the blue brightness in the display panel 100.

Furthermore, the sum of the thickness of the red color filter 710 and the thickness of the white light-emitting layer 511 is greater than or equal to the sum of the thicknesses of the blue color filter 730, the main light-emitting layer 522, the auxiliary light-emitting layer 523, and the blue light-emitting layer 521. The sum of the thickness of the green color filter 720 and the thickness of the white light-emitting layer 511 is greater than or equal to the sum of the thicknesses of the blue color filter 730, the main light-emitting layer 522, the auxiliary light-emitting layer 523 and the blue light-emitting layer 521. The thickness of the white light-emitting layer 511 is equal to the thickness of the main light-emitting layer 522.

When the thickness of the red color filter 710 and the thickness of the green color filter 720 are each greater than the sum of the thickness of the blue color filter 730, the thickness of the auxiliary light-emitting layer 523, and the thickness of the blue light-emitting layer 521, the blue brightness in the display panel 100 is further improved. When the thickness of the red color filter 710 and the thickness of the green color filter 720 are each equal to the sum of the thickness of the blue color filter 730, the thickness of the auxiliary light-emitting layer 523, and the thickness of the blue light-emitting layer 521, the film layers of the display panel 100 are flatter and smoother.

Embodiment 4

FIG. 5 discloses a schematic diagram of a display panel according to a fourth embodiment of the present application. As shown in FIG. 5, the difference from the second embodiment is that the main light-emitting layer 522 is disposed between the blue light-emitting layer 521 and the cathode 600.

In particular, it is equivalent to arranging a blue light-emitting material between the main light-emitting layer 522 and the anode 300. During the manufacturing process of the display panel 100, the anodes 300 arranged in a matrix are manufactured on the substrate 200, and then the blue light-emitting layer 521 is manufactured on the anode 300 corresponding to each blue color filter 730. Compared with the solution of the first embodiment, the solution of this embodiment will not cause the blue light-emitting material to enter the main light-emitting layer 522 and affect the white light-emitting layer 511 in the first light-emitting region 510 to emitting white light.

Embodiment 5

Figure 6:
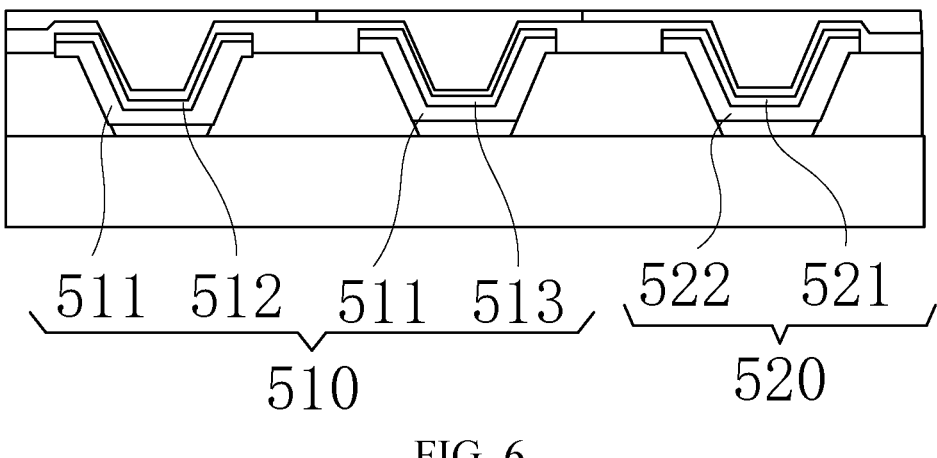
FIG. 6 discloses a schematic diagram of a display panel according to a fifth embodiment of the present application.

FIG. 6 discloses a schematic diagram of a display panel according to a fifth embodiment of the present application. As shown in FIG. 6, different from the second embodiment of the present application, a green light-emitting layer 513 is further arranged between the white light-emitting layer 511 and the cathode 600 of the first light-emitting region 510 corresponding to the green color filter 720, and a red light-emitting layer 512 is further disposed between the white light-emitting layer 511 and the cathode 600 of the first light-emitting region 510 corresponding to the red color filter 710.

In particular, the first light-emitting region 510 further includes a red light-emitting layer 512 and a green light-emitting layer 513, where the red light-emitting layer 512 is made of a red light emitting material, and the green light-emitting layer 513 is made of a green light emitting material. The red light-emitting layer 512 corresponds to the red color filter 710 in the filter layer 700 and is arranged between the white light-emitting layer 511 and the cathode 600. The green light-emitting layer 513 corresponds to the green color filter 720 in the filter layer 700 and is disposed between the white light-emitting layer 511 and the cathode 600.

By adding the light-emitting layer 500 of the corresponding color to the corresponding color filter, the brightness attenuation of each color filter in the display panel 100 can be alleviated, the service life of the display panel 100 can be improved, and the overall brightness of the display panel 100 can be improved.

Of course, it is also possible that a green light-emitting layer 513 is further disposed between the white light-emitting layer 511 and the anode 300 corresponding to the green color filter 720 in the first light-emitting region 510, and a red light-emitting layer 512 is further disposed between the white light-emitting layer 511 and the anode 300 corresponding to the red color filter 710 in the first light-emitting region 510.

Alternatively, a green light-emitting layer 513 may also be disposed between the white light-emitting layer 511 and the cathode 600 corresponding to the green color filter 720 in the first light-emitting region 510, and disposed between the white light-emitting layer 511 and the anode 300 corresponding to the green color filter 720 in the first light-emitting region 510. A red light-emitting layer 512 may also be disposed between the white light-emitting layer 511 and the cathode 600 corresponding to the red color filter 710 in the first light-emitting region 510, and between the white light-emitting layer 511 and the anode 300 corresponding to the red color filter 710 in the first light-emitting region 510.

Figure 8:
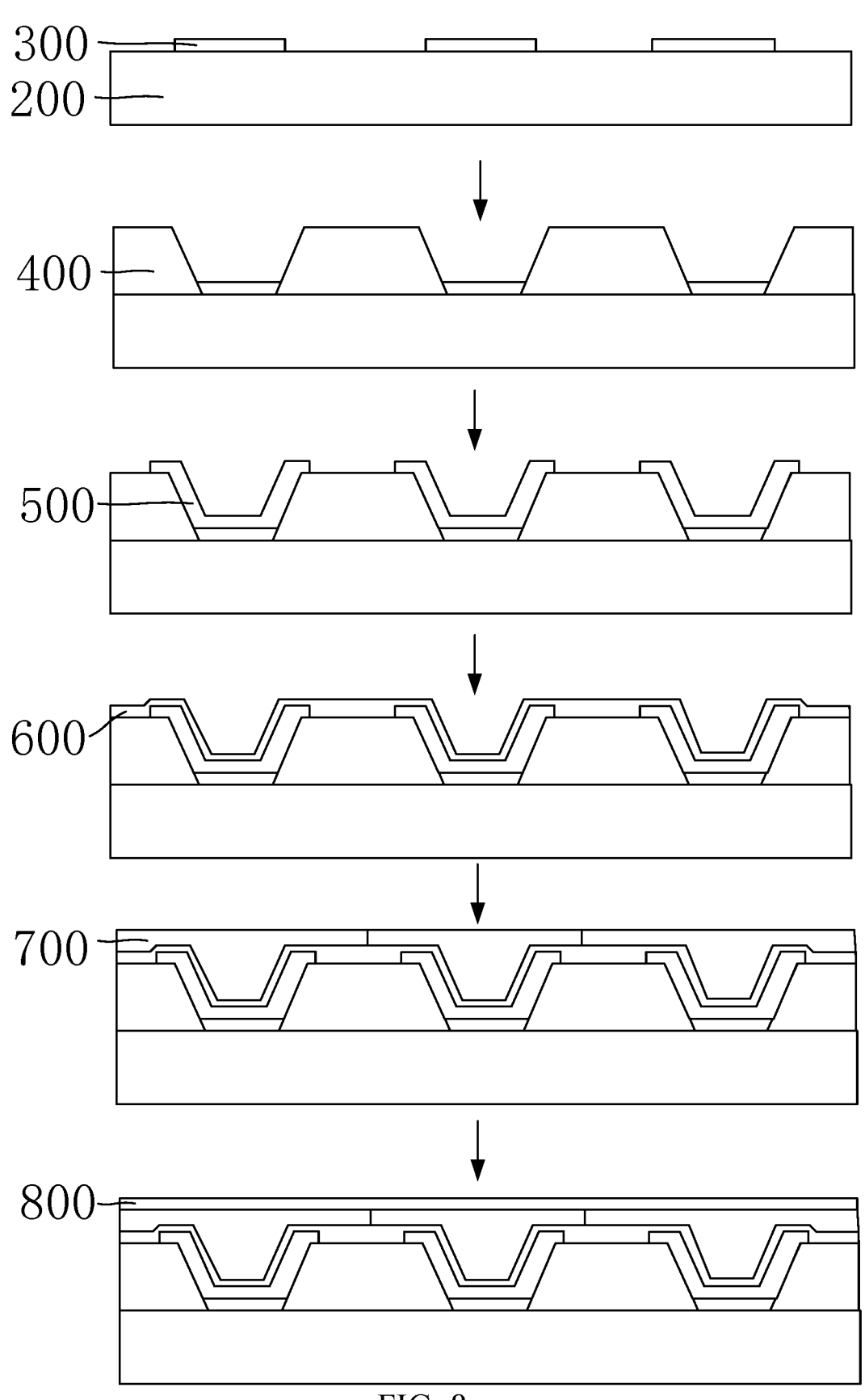
FIG. 8 discloses a manufacturing process of a first display panel of the present application.

The application further discloses a method for manufacturing a display panel, which can be used to prepare the above display panel. For the method for manufacturing the display panel, the application provides the following design. As shown in FIG. 7 and FIG. 8, the present application further discloses a method of manufacturing a display panel 100, which is the manufacturing method of the first embodiment of the present application, including the following operations:

S1: manufacturing a plurality of anodes arranged in a matrix on the substrate;

S2: depositing a light-shielding material on the anode, and forming a pixel defining layer disposed on the substrate through a mask, where the pixel defining layer between two adjacent anodes is a non-opening region, and an opening region is formed between two adjacent non-opening regions of the pixel defining layer;

S3: forming a light-emitting layer in the opening region that is composed of a first light-emitting region and a second light-emitting region arranged side by side, where the first light-emitting region includes a white light-emitting layer made of a white light-emitting material, and the second light-emitting region includes a blue light-emitting layer, where the blue light-emitting layer is made of a blue light-emitting material;

S4: forming a cathode on the light-emitting layer;

S5: forming a filter layer on the cathode, so that the blue color filter in the filter layer is disposed on the blue light-emitting layer in the second light-emitting region, and the green color filter and red color filter in the filter layer are each disposed on the white light-emitting layer in the first light-emitting region; and S6: forming a packaging layer on the filter to obtain a display panel.

Figures 9, 10:
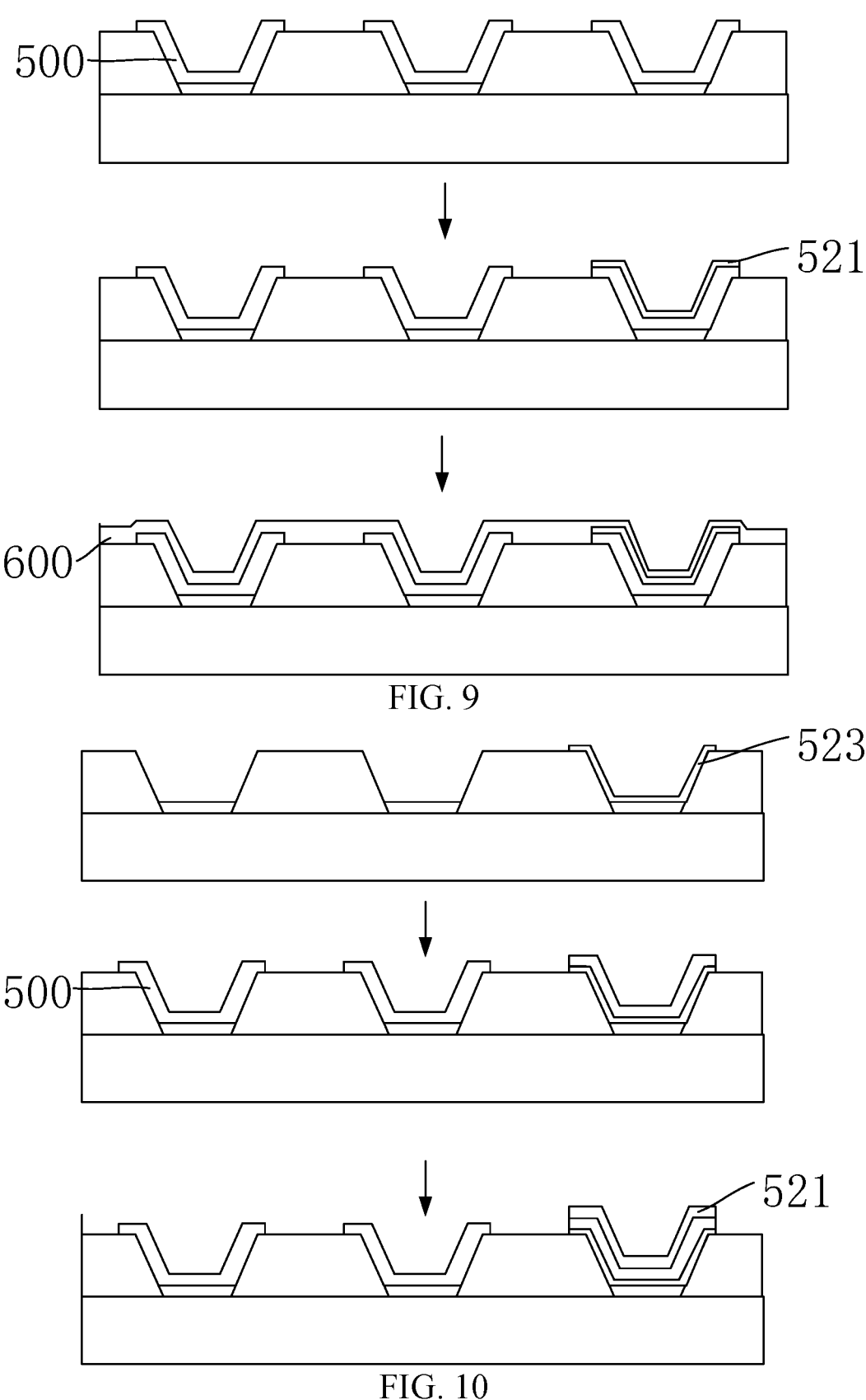
FIG. 9 discloses a manufacturing process of a second display panel of the present application.
FIG. 10 discloses a manufacturing process of a third display panel of the present application.

As shown in FIG. 9, the method for manufacturing the display panel of the second embodiment of the present application is disclosed. The difference from the method of manufacturing the first embodiment is that the formation of the main light-emitting layer 522 is added between the formation of the blue light-emitting layer 521 and the formation of the anode 300, and the main light-emitting layer 522 is formed in the same layer as the white light-emitting layer 511 in the first light-emitting region 510.

In particular, the step S3 further includes:

S31: forming a light-emitting layer in the opening that is composed of a first light-emitting region and a second light-emitting region that are arranged side by side, where the first light-emitting region includes a white light-emitting layer made of a white light-emitting material, and the second light-emitting region includes a main a light-emitting layer, where the main light-emitting layer is made of a white light-emitting material, S32: disposing a blue light-emitting layer on the main light-emitting layer, where the blue light-emitting layer is made of a blue light-emitting material.

The white light-emitting layer 511 in the first light-emitting region 510 and the main light-emitting layer 522 in the second light-emitting region 520 are made in the same layer, and the blue light-emitting layer 521 is manufactured on the main light-emitting layer 522 by a printing process.

Further, as shown in FIG. 10, a method for manufacturing a display panel according to the third embodiment of the present application is disclosed. Different from the method of manufacturing the second embodiment, before forming the main light-emitting layer 522, a step of forming an auxiliary light-emitting layer 523 is added.

In particular, before said step S31, the following step is further included:

S30: forming an auxiliary light-emitting layer in the opening region, where the auxiliary light-emitting layer is made of a blue light-emitting material.

S31: forming a light-emitting layer in the opening region that is composed of a first light-emitting region and a second light-emitting region that are arranged side by side, where the first light-emitting region includes a white light-emitting layer made of a white light-emitting material, and the second light-emitting region includes a main light-emitting layer, where the main light-emitting layer is made of white light emitting material.

The auxiliary light-emitting layer 523 is disposed between the anode 300 and the main light-emitting layer 522.

It should be noted that the limitations of various operations involved in this solution will not be deemed to limit the order of the operations, provided that they do not affect the implementation of the specific solution, so that the operations written earlier may be executed earlier or they may also be executed later or even at the same time. As long as the solution can be implemented, they should all be regarded as falling in the scope of protection of this application.

It should be noted that the inventive concept of the present application can be formed into many embodiments, but the length of the application document is limited and so these embodiments cannot be enumerated one by one. The technical features can be arbitrarily combined to form a new embodiment, and the original technical effect may be enhanced after the various embodiments or technical features are combined.

The foregoing description is merely a further detailed description of the present application made with reference to some specific illustrative embodiments, and the specific implementations of the present application will not be construed to be limited to these illustrative embodiments. For those having ordinary skill in the technical field to which this application pertains, numerous simple deductions or substitutions may be made without departing from the concept of this application, and shall all be regarded as falling in the scope of protection of this application.

What is claimed is:

1. A display panel, comprising:
a substrate;
a plurality of anodes, arranged on the substrate in a matrix;
a pixel defining layer, disposed on the substrate and comprising an opening region and a non-opening region, the non-opening region being disposed between every two adjacent anodes;
a light-emitting layer, disposed in each opening region;
a cathode, covering the light-emitting layer and the pixel defining layer; and
a filter layer, disposed on a side of the cathode facing away from the substrate and comprising a plurality of red color filters, a plurality of green color filters and a plurality of blue color filters;
wherein the light-emitting layer comprises a plurality of first light-emitting regions and a plurality of second light-emitting regions, wherein the plurality of first light-emitting regions respectively correspond to the plurality of red color filters and the plurality of green color filters, and wherein the plurality of second light-emitting regions respectively correspond to the plurality of blue color filters in the filter layer, wherein each of the plurality of second light-emitting regions comprises a blue light-emitting layer made of a blue light-emitting material;
wherein each of the plurality of first light-emitting regions comprises a white light-emitting layer made of a white light emitting material, and the white light-emitting layer is disposed corresponding to each of the red color filter and the green color filter;
wherein each of the plurality of second light-emitting regions further comprises a main light-emitting layer made of a white light emitting material and disposed between the anode and the blue light-emitting layer.

2. The display panel as recited in claim 1, wherein each of the plurality of first light-emitting regions comprises a white light-emitting layer made of a white light-emitting material, and wherein the white light-emitting layer is disposed corresponding to each of the red color filter and the green color filter.

3. The display panel as recited in claim 1, wherein a brightness of the first light-emitting region is equal to that of the second light-emitting region.

4. The display panel as recited in claim 1, wherein the second light-emitting region further comprises an auxiliary light-emitting layer disposed between the anode and the main light-emitting layer, wherein the auxiliary light-emitting layer is made of a blue light-emitting material.

5. The display panel as recited in claim 4, wherein a sum of a thickness of the red color filter and a thickness of the white light-emitting layer is greater than or equal to a sum of thicknesses of the blue color filter, the main light-emitting layer, the auxiliary light-emitting layer, and the blue light-emitting layer;

wherein a sum of a thickness of the green color filter and a thickness of the white light-emitting layer is greater than or equal to the sum of the thicknesses of the blue color filter, the main light-emitting layer, the auxiliary light-emitting layer, and the blue light-emitting layer; and wherein the thickness of the white light-emitting layer is equal to the thickness of the main light-emitting layer.

6. The display panel as recited in claim 1, wherein the main light-emitting layer is disposed in a same layer as the white light-emitting layer in the first light-emitting region.

7. The display panel as recited in claim 6, wherein the main light-emitting layer is disconnected from and insulated from an adjacent white light-emitting layer.

8. The display panel as recited in claim 1, wherein a thickness of the green color filter and a thickness of the red color filter in the filter layer are each greater than a thickness of the blue color filter.

9. The display panel as recited in claim 1, wherein a thickness of the red color filter is equal to a sum of a thickness of the blue light-emitting layer and a thickness of the blue color filter; and wherein a thickness of the green color filter is equal to the sum of the thickness of the blue light-emitting layer and the thickness of the blue color filter.

10. The display panel as recited in claim 1, wherein the first light-emitting region further comprises a red light-emitting layer and a green light-emitting layer, the red light-emitting layer being made of a red light-emitting material, and the green light-emitting layer being made of a green light-emitting material;

wherein the red light-emitting layer corresponds to the red color filter in the filter layer and is disposed between the respective white light-emitting layer and the respective cathode, and wherein the green light-emitting layer corresponds to the green color filter in the filter layer, and is disposed between the respective white light-emitting layer and the respective cathode.

11. The display panel as recited in claim 10, wherein there is further disposed a green light-emitting layer between the respective white light-emitting layer and the respective anode corresponding to the green color filter; and wherein there is further disposed a red light-emitting layer between the respective white light-emitting layer and the respective anode corresponding to the red color filter.

12. The display panel as recited in claim 1, wherein the blue light-emitting layer has a thickness of 5 nm-15 nm.

13. The display panel as recited in claim 1, wherein the plurality of blue color filters are in direct contact with the cathode, the plurality of red color filters are in direct contact with the cathode, and the plurality of green color filters are in direct contact with the cathode.

14. The display panel as recited in claim 1, wherein the white light-emitting layer corresponding to the red color filter is disconnected from and insulated from the white light-emitting layer corresponding to the green color filter in the first light-emitting region.

15. A display device, comprising a circuit board and a display panel, the circuit board being electrically connected to the display panel;

wherein the display panel comprises:

a substrate;

a plurality of anodes, arranged on the substrate in a matrix;

a pixel defining layer, disposed on the substrate and comprising an opening region and a non-opening region, the non-opening region being disposed between every two adjacent anodes;

a light-emitting layer, disposed in each opening region;

a cathode, covering the light-emitting layer and the pixel defining layer; and a filter layer, disposed on a side of the cathode facing away from the substrate and comprising a plurality of red color filters, a plurality of green color filters and a plurality of blue color filters;

wherein the light-emitting layer comprises a plurality of first light-emitting regions and a plurality of second light-emitting regions, wherein the plurality of first light-emitting regions respectively correspond to the plurality of red color filters and the plurality of green color filters, and wherein the plurality of second light-emitting regions respectively correspond to the plurality of blue color filters in the filter layer, wherein each of the plurality of second light-emitting regions comprises a blue light-emitting layer made of a blue light-emitting material;

wherein each of the plurality of first light-emitting regions comprises a white light-emitting layer made of a white light emitting material, and the white light-emitting layer is disposed corresponding to each of the red color filter and the green color filter;

wherein each of the plurality of second light-emitting regions further comprises a main light-emitting layer made of a white light emitting material and disposed between the anode and the blue light-emitting layer.

16. A method for manufacturing a display panel, for making a display panel, comprising:

manufacturing a plurality of anodes disposed in a matrix on the substrate;

depositing a light-shielding material on the anode, and forming a pixel defining layer on the substrate using a mask, wherein the pixel defining layer comprises a non-opening region between every two adjacent anodes, and an opening region between every two adjacent non-opening regions;

forming a light-emitting layer in the opening region, the light-emitting layer comprising a first light-emitting region and a second light-emitting region arranged side by side, wherein the first light-emitting region comprises a white light-emitting layer made of a white light-emitting material, and the second light-emitting region comprises a blue light-emitting layer made of a blue light-emitting material;

forming a cathode on the light-emitting layer; and forming a filter layer on the cathode, wherein a blue color filter in the filter layer is disposed on the blue light-emitting layer in the second light-emitting region, and the green color filter and red color filter in the filter layer are each disposed on the white light-emitting layer in the first light-emitting region;

wherein the operation of forming a light-emitting layer in the opening region, the light-emitting layer comprising a first light-emitting region and a second light-emitting region arranged side by side, wherein the first light-emitting region includes a white light-emitting layer made of a white light-emitting material, and the second light-emitting region includes a blue light-emitting layer made of a blue light-emitting material comprises:

forming a light-emitting layer in the opening region, the light-emitting layer comprising a first light-emitting region and a second light-emitting region arranged side by side, wherein the first light-emitting region comprises a white light-emitting layer made of a white light-emitting material, and wherein the second light-emitting region comprises a main a light-emitting layer made of a white light-emitting material; and disposing the blue light-emitting layer on the main light-emitting layer.

17. The method as recited in claim 16, further comprising the following operation subsequent to the operation of forming a filter layer on the cathode wherein the blue color filter in the filter layer is disposed on the blue light-emitting layer in the second light-emitting region, and the green color filter and red color filter in the filter layer are each disposed on the white light-emitting layer in the first light-emitting region:

forming a packaging layer on the filter layer to obtain the display panel.

18. The method as recited in claim 16, wherein the white light-emitting layer in the first light-emitting region is formed in the same layer as the main light-emitting layer in the second light-emitting region, and wherein the blue light-emitting layer is formed on the main light-emitting layer by a printing process.

19. The method as recited in claim 16, further comprising the following operations prior to the operation of forming a light-emitting layer in the opening region, the light-emitting layer comprising a first light-emitting region and a second light-emitting region arranged side by side, wherein the first light-emitting region comprises a white light-emitting layer made of a white light-emitting material, and the second light-emitting region comprises a main a light-emitting layer made of a white light-emitting material:

forming an auxiliary light-emitting layer in the opening region, the auxiliary light-emitting layer being made of a blue light-emitting material; and forming a light-emitting layer in the opening region, the light-emitting layer comprising a first light-emitting region and a second light-emitting region arranged side by side, wherein the first light-emitting region comprises a white light-emitting layer made of a white light-emitting material, and the second light-emitting region includes a main a light-emitting layer made of a white light-emitting material;

wherein the auxiliary light-emitting layer is disposed between the anode and the main light-emitting layer.

* * * * *